United States Patent [19]

Bjorklund et al.

[11] Patent Number: 4,647,155

[45] Date of Patent: Mar. 3, 1987

[54] MULTI-LASER OPTICAL SIGNAL RECORDERS

[75] Inventors: Henry S. Bjorklund; Daniel N. Cisneros; Raymond Yardy, all of Tucson, Ariz.

[73] Assignee: International Business Machines Corporation, Armonk, N.Y.

[21] Appl. No.: 709,864

[22] Filed: Mar. 8, 1985

[51] Int. Cl.$^4$ .................................................. G02B 7/02
[52] U.S. Cl. ..................................... 350/252; 350/417
[58] Field of Search ................................ 350/236–237, 350/252, 255, 321, 518, 574, 320, 417; 369/44, 100, 121; 372/108

[56] References Cited

U.S. PATENT DOCUMENTS

| | | | |
|---|---|---|---|
| 3,112,627 | 12/1963 | Gissel | 350/255 |
| 3,751,139 | 8/1973 | Malherbe | 350/252 |
| 4,035,081 | 7/1977 | Sepp et al. | 356/350 |
| 4,050,037 | 9/1977 | Knowles et al. | 350/252 |
| 4,431,267 | 2/1984 | Finck et al. | 350/237 |
| 4,521,110 | 6/1985 | Roberts et al. | 356/350 |
| 4,541,689 | 9/1985 | Howard et al. | 350/255 |

FOREIGN PATENT DOCUMENTS

| | | | |
|---|---|---|---|
| 285426 | 6/1915 | Fed. Rep. of Germany | 350/255 |
| 1220630 | 7/1966 | Fed. Rep. of Germany | 350/518 |
| 136985 | 8/1984 | Japan | 372/108 |

Primary Examiner—William H. Punter
Attorney, Agent, or Firm—H. F. Somermeyer

[57] ABSTRACT

A multi-layer assembly includes a support block with a plurality of circular cylinder bores, each receiving optical elements. Juxtaposed along the length of each of the bores in a circumferentially spaced-apart relation is a pair of positioning rods having surfaces extending into the bore. The surfaces are precisely aligned with a desired optical axis to be established by the optical element. A plunger pushes the optical element against the rods to establish the optical axis. Lasers and adjustment apparatus are included in the assembly.

10 Claims, 5 Drawing Figures

MULTI-LASER OPTICAL SIGNAL RECORDERS

FIELD OF THE INVENTION

The present invention relates to mounting multiple lasers and associated collimating lenses in a simple, but precise, arrangement, particularly for supplying multiple laser light beams in an optical signal recorder.

BACKGROUND OF THE INVENTION

Optical recorders have been used for recording video signals as well as other forms of information-bearing signals. Many of the recorders use but a single laser and a single beam of light. A disadvantage to such single-beam optical signal recorders is that the recording cannot be immediately verified; to verify signal recording requires an additional rotation of the optical record disk.

Some optical signal recorders, particularly for making masters of video disks, have employed two-laser systems, one laser providing a beam for recording or writing information onto the record disk, while a second laser provides a light beam for sensing the just-recorded information. Optical elements combine the read and write beams such that the read beam immediately follows the writing beam for effecting, almost simultaneous, read-after-write verification. Typically, a two-laser systems requires that the writing laser and the reading laser operate at different wave lengths, and thus were supported in separate housings. Such separation imposes critical alignment and adjustment procedures, particularly where high density optical recording is desired. Thermally-induced changes in dimensions also create stability problems.

Accordingly, it is desired to provide a simpler apparatus which facilitates the independent adjustment of the lasers and their respective associated optical elements, such as collimating lenses and the like, while avoiding thermal gradient problems. It is also desired to minimize the size of the assembly such that a compact optical signal recorder is achievable, yet one that provides extremely high areal density recording.

SUMMARY OF THE INVENTION

An optical device employing the present invention includes a plurality of circularly-cylindrical optical elements, such as collimating lenses and coaxially-disposed laser elements. The optical elements supply light along predetermined and almost parallel spaced-apart light paths. That is, it is desired to align the predetermined light paths precisely with some desired light paths having a predetermined geometric configuration. A support body has a plurality of substantially parallel-extending, elongated-circular-cylindrical first bores, each first bore having an internal diameter slightly greater than the external diameter of the optical elements being housed within the bore. Associated with each first bore is a pair of optical element positioning rods disposed in the body in a precise relationship with the desired light path configuration with the rods extending along the length of the first bores. A portion of the surface of each of the rods extends into a first bore for providing two reference surfaces that are circumferentially spaced apart and subtend an angle of less than 180 degrees. Opposite the positioning rods in each of the first bores is a radially-extending bore which opens into the first bore and extends radially-outwardly for movably receiving a plunger. A spring on the outer portion of the body yieldably urges the plunger against the housed optical element forcing it against the reference surfaces.

In a preferred arrangement, one surface of the body serves as a reference-and-output surface with each of the first bores having an output aperture at such surface. On the opposite side of the body, a laser assembly is mounted such that a light beam is emitted coaxially to the respective first bore. A threaded cylinder in engagement with the optical elements with a worm-gear arrangement pushes the optical elements against a compression spring, such that the axial position of the optical element can be precisely adjusted with respect to the laser for eliminating thermally-induced optical errors between a plurality of lasers.

The foregoing and other objects, features, and advantages of the invention will be apparent from the following more particular description of preferred embodiments of the invention, as illustrated in the accompanying drawings.

DETAILED DESCRIPTION

Figure 1:
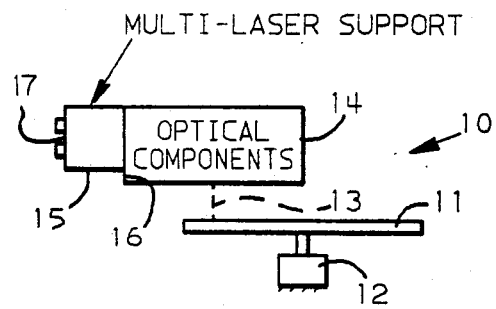
FIG. 1 is a simplified diagrammatic showing an optical disk signal recorder employing the present invention.

Referring now more particularly to the drawings, like numerals indicate like parts and structural features in the various views.

An optical disk signal recorder 10, preferably of the data recording type, includes a rotatable optical record disk 11, supported and rotated by motor 12. Light path 13 extends between optical record disk 11 and a set of known optical components 14 for recording signals onto disk 11 and for sensing or reading recorded signals from disk 11. A multilaser support 15, mounted on components 14 and constructed in accordance with the teaching of the present invention, provides both recording and sensing light beams through optical components 14 to the common light path 13. Multilaser support 15 has a reference output face 16 which for precisely mounting the laser assembly to optical components 14 using known techniques (details omitted for clarity); laser support 15 and optical components 14 may have a common frame and housing. Laser support 15 includes outwardly facing surface 17 which receives the plurality of laser elements as will become apparent. A first embodiment of the present invention employed two lasers—one for supplying a recording or writing light beam, and a second for supplying a read or sensing light beam. The emitted light beams were required to be substantially parallel leaving supports 15 through light output apertures 17a of reference surface 16. As will become apparent, the output light beams 29, while preferred to be precisely parallel, can be either converging or diverging depending upon the design choices made for optical components 14. A pair of semiconductive lasers 20 are mounted on a subplate 21 at surface 17 for respectively emitting a light beam along the arrows 29 representing desired parallel-extending optical axes. Surface 1617 extends substantially parallel to the arrows 29 represented optical axes and extends between surfaces 16 and 17 as a body 22 outer surface. A pair of subplates 21, respectively, receive the flanges of lasers 20 allowing the laser element to extend into the respective elongated-cylindrical first bore 19 formed within body 22 of support 15. The subplates 21 minimize the spacing of lasers 20. Bores 19 each have a diameter slightly greater than the diameter of the flange on each laser 20. This combination enables the diameter of the collimating lens 30 to be the same as the diameter of the laser 20 flange 20F. Two pairs of machine screws 24, respectively secure aperture retainer straps 23 to body 22 for securing lasers 20 onto body 22. A wavy spring washer 25 is interposed between the head of each machine screw 24 and the respective retainer strap 23. Retainer straps 23 each have a central aperture 42 for allowing access to the electrical terminals 41 of the lasers 20.

A beam-collimating lens 30 is disposed in each of the elongated-circular bores 19 for respectively collimating the lasers 20 emitted light beams. A coil compression spring 18 is disposed between an annular shoulder 28 of body 22 and a radially-inwardly-extending annular flange 30F in each of the collimating lenses 30. Each flange 30F not only retains a spring 18 but also the optical elements (not shown) of the collimating lens. A spring 18 is coaxially disposed with the desired optical axis within the respective bores 19. Shoulder 28 and subplate 21 form first and second retention means for each of the cylindrical bores. The collimating lenses 30 are to be independently axially adjusted for proper collimating action after the lasers 20 and the lenses 30 have been mounted within body 22. At the inward end of each collimating lens 30 is a tubular, circular adjustment screw 26 coaxial of lens 30 and extending toward the respective laser 20. Tubular screw 26 threadingly engages nut 27 which has a helical gear 40 disposed around its circular outer perimeter. A pair of headless screws 37 are threadingly disposed within body 22 and are in gearing engagement with the respective helical threads 40 of nut 27, thereby forming a worm gear. A hex wrench inserted into the outwardly facing end of a headless screw 37 rotates a nut 27 for precisely axially adjusting the position of a lens 30 within its bore 19 by compressing and decompressing a spring 18. A retainer screw 38 is threadingly engaged to body 22 to extend into slot 39 of screw 26 for preventing rotation of screw 26 to secure the axial location of the corresponding collimating lens 30.

The alignment of the optical axis of the collimating lenses 30 to the desired optical axis, represented by arrows 29, is achieved through the use of a plurality of positioning rods. In a preferred embodiment, three positioning rods 31, 32, and 33, are embedded in body 22 such that a small circumferential surface portion of a pair of the positioning rods 31–33 extend into each of the bores 19. Positioning rods 31 and 32 form a first pair having precisely parallel surfaces extending into a first one of the bores 19. The positioning rods 31, 32 are circumferentially spaced apart at about 90 degrees. In a similar manner, positioning rods 32 and 33 extend into a second one of the bores 19 forming two precisely parallel reference surfaces along the axial length of that bore and are circumferentially displaced about the same angle as rods 31, 32. Use of a common rod 32 enables a precise set of reference surfaces for adjacent circular bores 19. For forcing the respective collimating lenses 30 against the reference surfaces are plungers 34 movably disposed in respective radially-extending bores opening onto the elongated bore 19. Preferably, each plunger 34 extends outwardly of body 22 to be yieldably urged radially-inwardly by leaf spring 35 secured to the body 22 by machine screw 36. It is preferred that plungers 34 have circularly-shaped ends and are fabricated from any known low friction plastic. The spring 35 urging on plungers 34 maintains lenses 30 securely against the respective positioning rods 31, 32, and 33.

The sliding support provided by the positioning rods 31–33 and plunger 34 facilitates assembly and adjustment. The materials of the assembly are suitably selected such that there is thermal compensation of the optical collimating function. When both lasers 20 have identical mounting configurations, then the construction of the assembly is identical for both lasers. The alignment of the desired optical axes represented by arrows 29 through a unitary adjustment of the body 22 using but a single reference surface 16, which is also the output surface of the laser assembly. Examination of the illustrations will show the adjustment of the collimating lenses 30 can be simply automated. The spring 18 and the compact assembly provide for stability of operation even with thermal changes.

Figure 5:
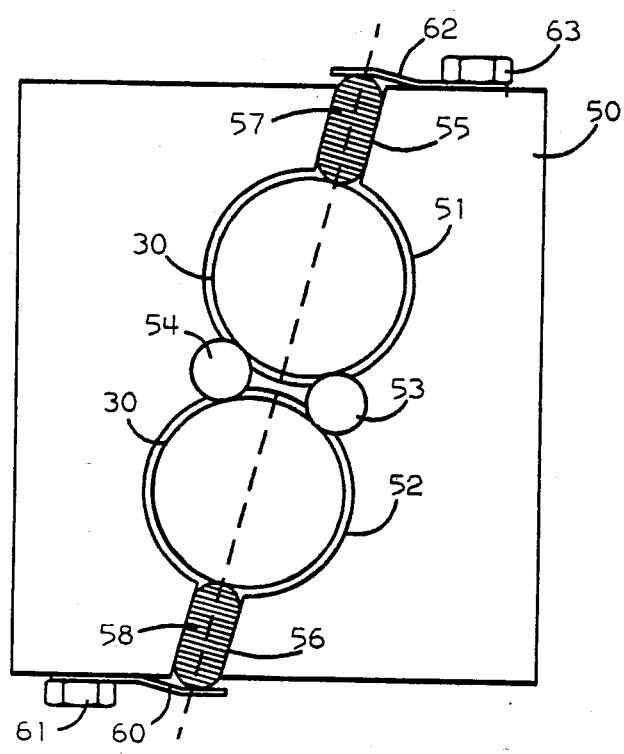
FIG. 5 illustrates an alternate embodiment of the two-laser mount usable with the FIG. 1 illustrated system.

FIG. 5 illustrates an alternate embodiment wherein the laser assembly body 50 has a pair elongated circular bores 51 and 52. To position a pair of lenses, a pair of positioning rods 53 and 54 are disposed within body 50 intermediate the bores 51, 52. Each of the positioning rods 53, 54 extend into the bores 51, 52 and has a reference surface for providing two reference surfaces in each bore 51, 52 that are precisely parallel and are circumferentially spaced apart a predetermined angle less than 180 degrees such that a pair of lenses 30 can be precisely positioned therein respectively. A pair of radially-extending bores 55, 56 respectively open the bores 51, 52 to outside the body 50. A pair of plungers 57, 58 movably disposed respectively in bores 55, 56 are spring-urged by springs 62 and 60 against the respective lenses 30. A pair of machine screws 61 and 63 secure the leaf springs 60 and 62 to body 50. This alternate embodiment allows one less positioning rod to be machined into the body 22 but does require extra machine screws and leaf springs for providing the precise positioning.

Figure 2:
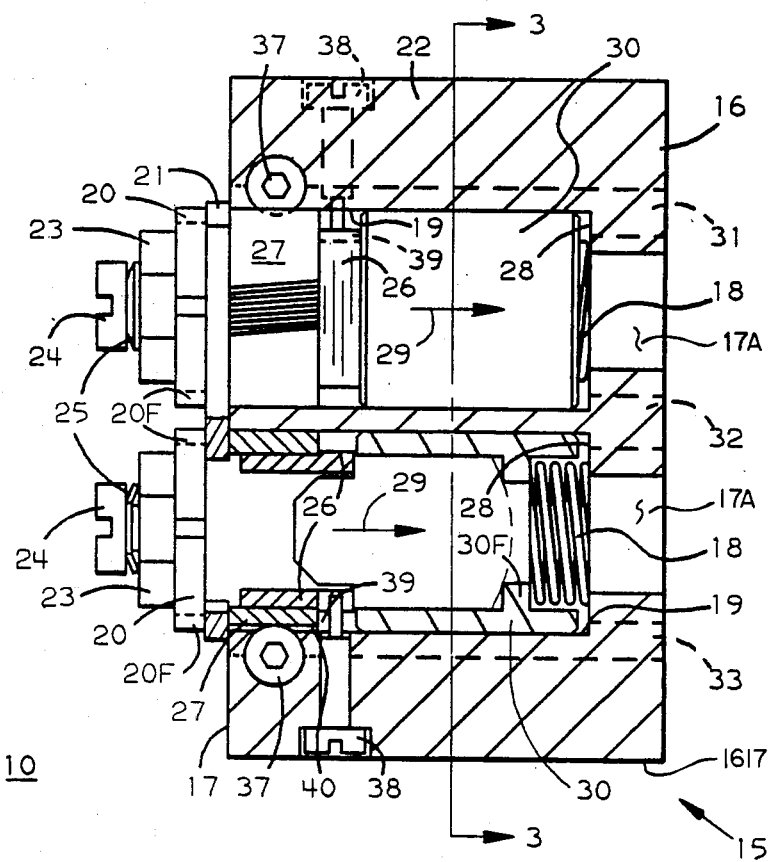
FIG. 2 is a simplified sectional view of a two-laser assembly used in the FIG. 1 illustrated recorder, and which illustrates the present invention.
Figure 3:
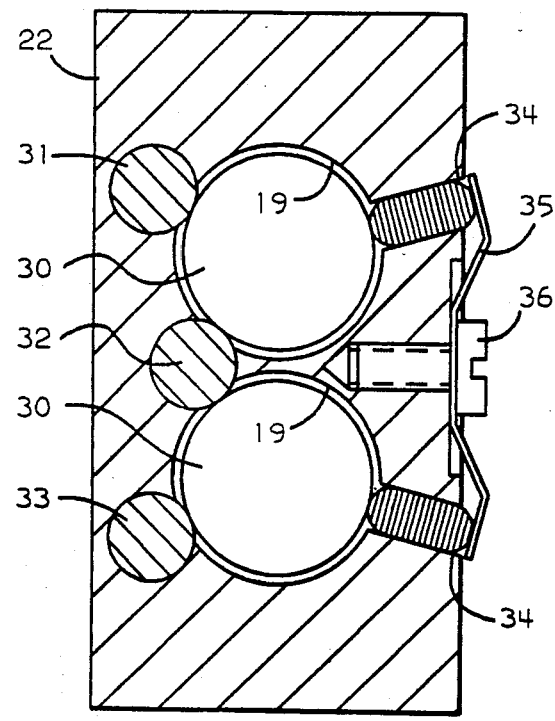
FIG. 3 is a simplified sectional view taken in the direction of the arrows along line 3—3 of FIG. 2.
Figure 4:
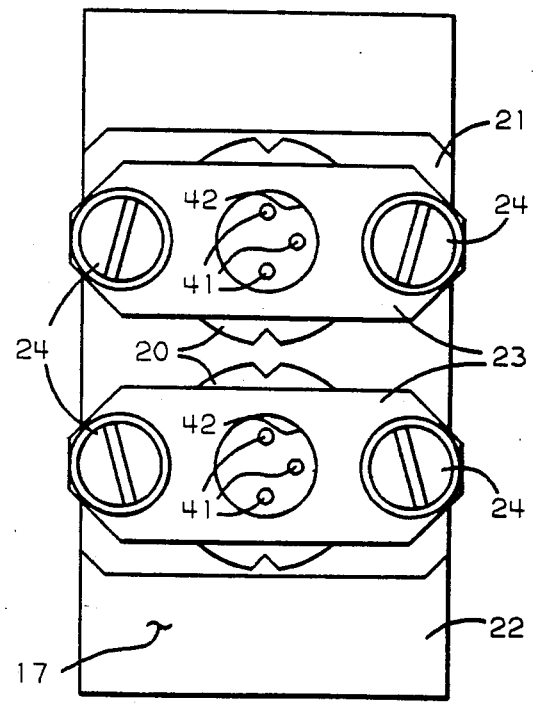
FIG. 4 is a side-elevational view of the FIG. 2 illustrated assembly.

The optical axes of lasers 20 are aligned with the respective collimating lenses 30 by sliding lasers 20 under clamp 23 while spring 25 is adjusted to give slight retaining pressure. After the optical axes are precisely aligned, screws 27 are tightened. This adjustment aligns both output beams to orthogonal with respect to face 16, while the location of the beam optical axes are determined by the optical centers of the respective lenses 30. To facilitate the just-described adjustment, strap 23 (FIGS. 2 and 4) is configured to expose the "V-shaped" notches in the flange 20F of each laser 20. Strap 23 and subplate 21 are suitably coated for low friction. Beam alignment adjustment is obtained by engaging the notches in flange 20F of each laser 20 with tooling (not shown) that moves laser 20 in two directions in a plane perpendicular to its optical axis.

Polarization is adjusted by rotating the laser 20 about its optical axis. Strap 23 clamps lasers 20 by the spring force of wavy spring washer 25 under the heads of screws 24 to allow adjusting movement while retaining the adjustment after screws 24 are tightened. After the adjustment is satisfactory and screws 24 tightened, the tooling is withdrawn.

While the invention has been particularly shown and described with reference to preferred embodiments thereof, it will be understood by those skilled in the art that various changes in form and details may be made therein without departing from the spirit and scope of the invention.

What is claimed is:

1. In an optical device having a plurality of circularly cylindrical optical elements each having a predetermined diameter, respectively, for supplying collimated light along predetermined light paths, in combination:
    a support body having a first plurality of substantially parallel elongated circularly cylindrical bores each having an internal diameter respectively slightly greater than said predetermined diameters for respectively receiving said cylindrical optical elements and extending through the body and disposed for enabling the device to supply said collimated light along said predetermined light paths and having first and second oppositely facing surfaces, each said surfaces terminating said first plurality of said elongated circular bores as respective apertures, respectively, and having a third surface means joining said first and second surfaces and said third surface means extending substantially parallel to said predetemrined light paths;
    at least a first plurality of optical element positioning rods disposed in said body in respective juxtaposition to said elongated circular bores such that a pair of two of said positioning rods have surfaces extending into each of the respective elongated circular bores in a precise parallel relationship to said respective predetermined light paths extending through said respective elongated circular bores;
    each said pair of said two positioning rods being circumferentially spaced apart in their respective elongated circular bore a predetermined angle of less than 180 degrees having its axes at the optical axes, respectively, and opening to said respective positioning rods;
    said support body further having said first plurality of radial bores extending radially respectively between said elongated circular bores and said third surface means such that opening said radial bores into said elongated circular bores, respectively, and opening to outside of said support body at said third surface means and being disposed in said support body diametrically opposite respectively, to said positioning rods for substantially bisecting each said predetermined angle, respectively;
    a first plurality of plungers movably disposed in said radial bores, respectively, for contacting said optical elements respectively disposed in said elongated circular bores; and
    resilient means disposed on said body and in yieldable urging contact with all of said plungers for forcing the plungers radially inwardly toward said respective elongated circular bores to push the respective optical elements against the respective pairs of said positioning rods such that all of said predetermined light paths are precisely established as said desired light paths, respectively, by said optical elements and having said precise geometric relationship.

2. In the optical device set forth in claim 1, further including, in combination:
    axial adjustment means in said support body for each of said elongated circular bores and disposed between said support body and a respective one of said optical elements in each of said elongated circular bores for axially slidably retaining said optical element;
    adjustment control means in each of said axial adjustment means extending from said bore to outside said support body for changing the axial adjustment means to slidably axially move said optical element for optically adjusting same;
    locking means in each of said axial adjustment means extending from outside said support body to lock said axial adjustment means in a fixed axial position; and
    each said axial adjustment means being coaxial with the respective elongated circular bore such that said desired optical axis is substantially coaxial therewith.

3. In the optical device set forth in claim 2, further including, in combination:
    a first plurality of laser means disposed on said support body at said second surface and being coaxial to respective ones of said elongated circular bores for respectively emitting laser light along said desired optical axes; and
    a subplate means disposed between said second surface and said first plurality of said laser means for retaining all of said axial adjustment means in the respective bores.

4. In the optical device set forth in claim 3, further including, in combination:
    an annular inwardly-facing shoulder in each of said elongated circular bores disposed in juxtaposition to a one of said oppositely facing surfaces and remote from another of said oppositely facing surfaces; and
    a coil compression spring of said axial adjustment means disposed in each of said elongated circular bores between said optical element and said shoulders, respectively for yieldably axially urging respective ones of said optical elements toward said another surface and being respectively coaxially disposed of said desired axes such that emission of radiation from the respective laser means passes through the coil compression springs whereby said slidable axial adjustment works against the coil compression spring.

5. In the optical device set forth in claim 4, further including, in combination:
    in each said axial adjustment means;
    a tubular screw disposed between the respective said optical element and said subplate means coaxially to said desired axis of the respective bore;
    a nut member threadingly engaged with said tubular screw and having a circularly cylindrical outer surface with outwardly-facing helical screw threads thereon and having a diameter less than the diameter of the respective elongated circular bore;
    a worm member slidingly engaged with the support body and being gearingly engaged with said helical screw threads and having an actuator portion extending outwardly of said support body such that rotation of the worm member rotates the nut for axially adjusting the optical element in the bore; and said optical element being in annular axial-bearing contact with one of said members and said subplate being in axial-bearing contact with another of said members.

6. In the optical device set forth in claim 5, further including, in combination:

all of said laser means being disposed on said second oppositely facing surface and all of said elongated circular bores opening through said first oppositely facing surface such that said first oppositely facing surface is a reference surface for mounting the support body to optical components for utilizing the laser emission of radiation; and all of said positioning rods being disposed such that said surface portions extending into said elongated circular bores subtend parallel lines whereby all of said desired optical axes being substantially parallel lines.

7. In the optical device set forth in claim 6, further including, in combination:

a one of said positioning rods in each pair of positioning rods having surface portions extending into a plurality of said elongated circular bores.

8. In the optical device set forth in claim 7, further including, in combination:

the number of said elongated circular bores is two and with three positioning rods in two pairs of positioning rods with the rods in each pair being circumferentially spaced apart at about ninety degrees; and a common surface in said third surface means through which said radial bores open to outside said support body and a single leaf spring secured to said support body and engaging both plungers for yieldably urging same against the respective optical elements.

9. In the optical device set forth in claim 3, further including, in combination:

a first plurality of retainer straps each having a low friction surface engaging a respective one of said laser means; and a first plurality of screw means threadingly engaged to said support body through said second surface and being in adjustable retaining engagement with respective ones of said retainer straps.

10. In an optical device for supplying a plurality of light beams from a reference surface of the optical device having a predetermined geometric relationship to each other and to the reference surface;

including, in combination:

a unitary body having a pair of elongated bores opening to said reference surface and to a second surface which is oppositely facing to said reference surface;

first and second annular retention means disposed coaxial to each of the bores and respectively being disposed first and second predetermined distances from said reference surface and arranged to stop axial motions in opposite directions;

a laser means disposed on said second surface and respectively extending into each of said elongated bores for supplying emission of radiation into and substantially coaxial to the respective bores;

a collimating lens axially slidably disposed in each of said elongated bores;

a compression coil spring disposed in each of said elongated circular bores between said collimating lens and said first annular retention means for yieldably axially urging the collimating lens away from said first retention means;

a tubular and annular nut-screw means disposed in each of said elongated circular bores between said second retention means and said collimating lens in the respective elongated circular bore and each being capable of axially lengthening and contracting for axially moving the collimating lens against the yieldable urging of said compression spring;

axial adjustment control means in operative connection to each of said nut-screw means and extending outside of said unitary body for changing the axial length of said nut-screw means for optically adjusting the collimating lens with respect to the respective laser means and said reference surface;

axial alignment means in each of said elongated circular bores for axially slidably supporting the collimating lens precisely along a respective desired optical axis;

a pair of axially elongated precision positioning rods disposed in circumferential spaced apart parallel relation along each of said elongated circular bores and subtending an angle of less than 180 degrees and each rod of each pair having a surface portion radially extending into the respective elongated circular bores with the surface portions all axially extending in precise parallelism to the respective desired axes of the respective elongated circular bores; and resiliently urging means in said support body and extending into each of said elongated circular bores along a radial line thereof for bisecting said subtended angle and engaging said collimating lens for yieldably urging same against said pair of positioning rods, respectively.

* * * * *